Feb. 3, 1970 R. EMEIS 3,492,969

APPARATUS FOR INDIFFUSING IMPURITY IN SEMICONDUCTOR MEMBERS

Filed Feb. 24, 1967 2 Sheets-Sheet 1

United States Patent Office 3,492,969
Patented Feb. 3, 1970

3,492,969
APPARATUS FOR INDIFFUSING IMPURITY IN SEMICONDUCTOR MEMBERS

Reimer Emeis, Ebermannstadt, Germany, assignor to Siemens Aktiengesellschaft, a corporation of Germany Filed Feb. 24, 1967, Ser. No. 618,530
Claims priority, application Germany, Feb. 25, 1966, S 102,224
Int. Cl. C23c *13/08*
U.S. Cl. 118—49.1 4 Claims

ABSTRACT OF THE DISCLOSURE

Apparatus for indiffusing impurity in semiconductor members for electronic semiconductor components by applying heat thereto in a high vacuum or neutral atmosphere contained in a vessel in which the semiconductor members and the impurity are received, at least one layer, consisting of semiconductor material of the same type as that of the semiconductor member, being provided on the inner surface of the vessel.

My invention relates to apparatus for indiffusing impurity in semiconductor members.

As is well known, portions of a semiconductor member can be highly doped or reversely doped or enriched with recombination centers by indiffusion of impurities therein. According to the so-called ampule methods, a plurality of semiconductor members are disposed together with a dopant source in a quartz ampule, which is evacuated, sealed by fusion and then heated to a prescribed diffusion temperature and maintained at this temperature until the dopant penetrates a desired depth into the semiconductor member. At the particularly high diffusion temperatures advantageous for silicon members, quartz ampules have the disadvantage that they permit undesired impurities to penetrate into the interior thereof and thereafter no longer possess adequate mechanical strength or durability. Furthermore, the formation of an oxidized surface layer has been observed on silicon discs thus treated, which in all probability impairs the diffusion process.

It is accordingly an object of my invention to provide apparatus for indiffusing impurities in a semiconductor member which avoids the aforementioned disadvantages of the heretofore known devices. More particularly, it is an object of my invention to avoid the penetration of undesirable impurities into the interior of the vessel in which the indiffusion process takes place and also to avoid the formation of oxidized surface layers which might tend to impair the diffusion process.

With the foregoing and other objects in view, I provide in accordance with my invention, apparatus for indiffusing impurity in semiconductor members for electronic semiconductor devices by heating in a neutral atmosphere, and especially in a high vacuum, with a vessel in which the semiconductor members and the impurity are received, wherein at least one layer consisting of semiconductor material of the same type as that of the semiconductor members is disposed on the inner surface of the vessel. While the diffusion process is being carried out, the vessel is evacuated or filled with an inert protective gas such as argon, for example.

Other features which are considered as characteristic for the invention are set forth in the appended claims.

The construction of operation of the invention, however, together with additional objects and advantages thereof, will be best understood from the following description of specific embodiments when read in connection with the accompanying drawings, in which.

Figures 1, 3, 4:
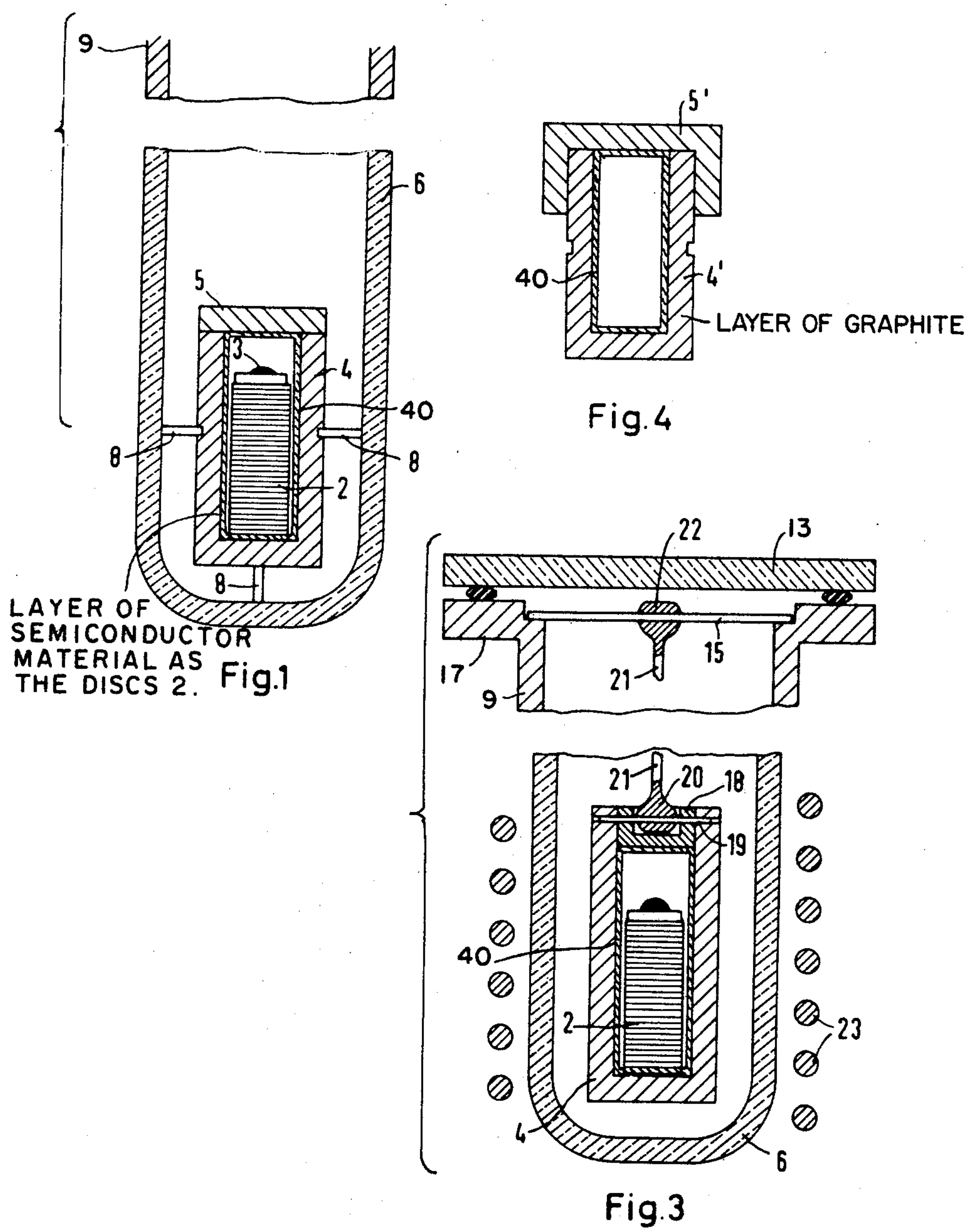
FIG. 1 is a diagrammatic sectional view, partly broken away, of parts of the apparatus constructed in accordance with my invention.
FIG. 3 is another embodiment of the parts shown in FIG. 1.
FIG. 4 is a sectional view of a modified form of the vessel included in the parts shown in FIGS. 1 and 3.

Referring now to the drawings and first particularly to FIG. 1 thereof, there is shown a stack 2 of disc-shaped semiconductor members or wafers located together with a source 3 of foreign substance or impurity in a vessel 4. The semiconductor discs contain additional impurities which during the production thereof are intentionally introduced into the semiconductor material and produce a specific conductivity type, and a limited amount of additional undesired and unavoidable impurities. The material of the vessel 4 and its cover 5 must have no greater concentration of the last-mentioned impurities than that of the semiconductor discs because the last-mentioned impurities vaporize in the interior of the vessel when subjected to heat treatment and undesirably contaminate the semiconductor discs. Consequently, at least a layer 40, consisting of semiconductor material of the same type as that of the semiconductor discs, is provided at the inner surface of the vessel. The semiconductor discs and the layer 40 or, in the alternative, the entire vessel 4 consist, for example, of silicon which has been obtained by pyrolytic decomposition of a gaseous silicon compound and, if desired, purified in one or more zone-melting operations. A piece of highly pure aluminum, for example, can be employed as the source 3 of impurity, a portion thereof being vaporized and indiffused from all sides into the silicon discs.

From a rod of, for example, 35 mm. diameter, a piece having a length of 80 mm. can be cut, from which by suitable boring or milling, the cup-shaped cylindrical vessel 4 is able to produce. The cover 5 can be severed from the same rod. In order to obtain such a tightly sealed closure that the vessel 4 can be evacuated, while, however, undesired impurities which diffuse out of the chamber 6 cannot penetrate into the vessel 4, the engaging surfaces of the vessel 4 and the cover 5 are advantageously lapped or ground flat. By disposing the vessel in an upright position so that its axis extends vertically, the semiconductor discs can be superimposed in a stack 2 without requiring additional means for holding and supporting them.

Figure 2:
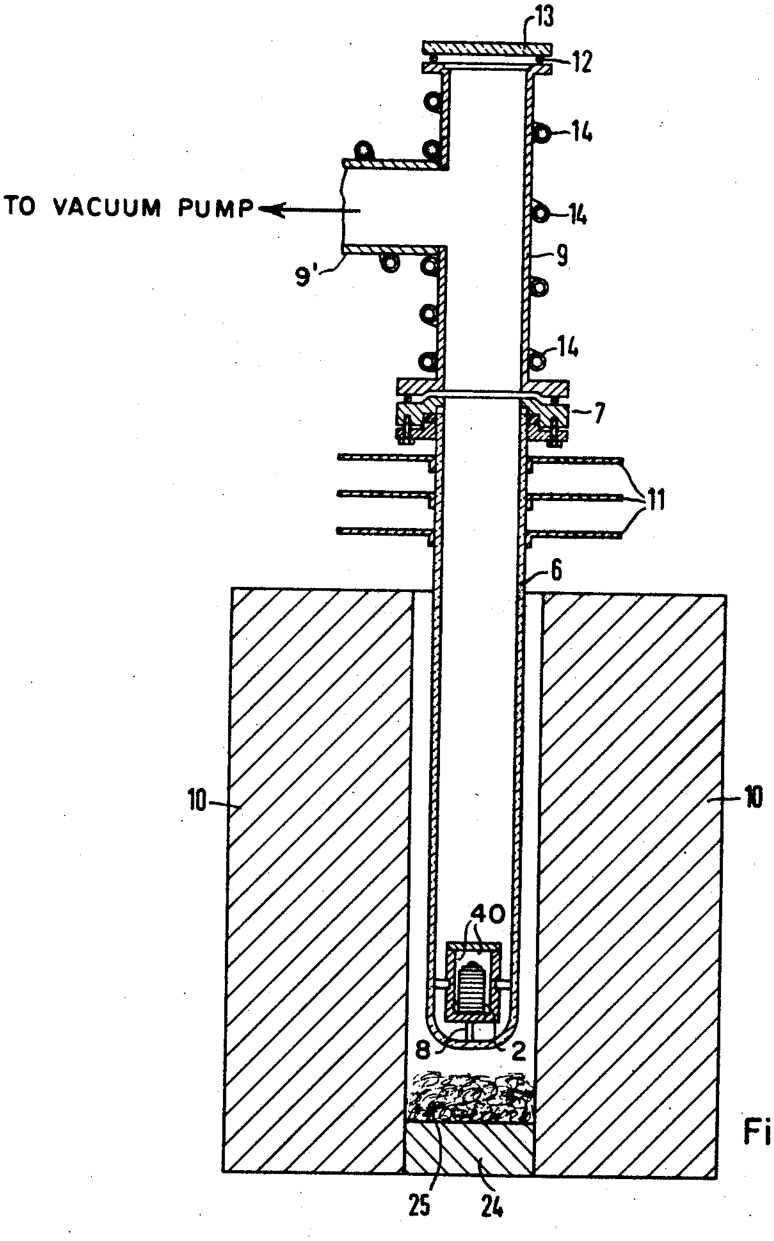
FIG. 2 is an embodiment of the apparatus of my invention including in reduced size the parts thereof shown in FIG 1.

The vessel 4 is supported or braced by spacer members such as quartz rods 8, for example, in a chamber 6 of sintered alumina or aluminum oxide, for example, and is thereby spaced on all sides from the walls of the chamber 6. According to FIG. 2 in which the embodiment of the apparatus of my invention is shown in its entirety, the chamber 6 has the shape of a tube closed on one side, the lower portion of which is inserted vertically into a shaft of a schematically illustrated vertically exopening of the resistance heater furance 10. The lower opening of the resistance heater furnace 10 as shown in FIG. 2 is closed with ceramic plug 24 and with heat-insulating material such as rock wool 25, for example. Metal rings 11, such as for example of aluminum, are press-fitted on the wall of the chamber 6 in the vicinity of the upper open end thereof which extends out of the furnace 10. The rings 11 serve as a shield against the heat emanating from the furnace and as cooling or heat dissipating members. The chamber 6 is secured to a T-shaped tube 9 by means of a ground-in joint or a crushed or pinched seal 7 or the like. The upper end of the T-shaped tube 9 as shown in FIG. 2 is vacuum-tightly closed by a sealing ring 12 and a glass plate 13, which may be clamped to the tube 9 by suitable means (not shown), while the horizontally disposed leg 9' of the tube 9 is suitably connected to a non-illustrated vacuum pump. The chamber 6 and the T-shaped tube comprises closed chamber means. The tube 9 and the seal 7 are cooled by cooling coils 14. Impurities which evaporate from the chamber wall 6 and the spacer supports 8 are thus continuously removed by the suction of the vacuum pump through the leg 9' of the tube 9. For this reason, as aforementioned, the construction of the chamber walls 6 and the spacer supports 8 of less than pure materials such as aluminum oxide, sintered alumina or quartz, will cause no harm. When employing the heat-resistant aluminum oxide, a diffusion temperature can be selected which is just below the melting point of silicon.

The silicon discs treated in the apparatus of my invention as shown, for example, in FIG. 2, may be doped with n-conductivity dopant at the beginning of the diffusion process at a uniform dopant concentration of about $10^{14}$ per cm.$^3$. The foreign substance or impurity which is indiffused into the silicon discs can be aluminum, for example. After a period of fifteen hours at a temperature of 1250° C., a layer approximately 90$\mu$ thick is doped into the surface of the semiconductor discs by the indiffusion of aluminum.

In FIG. 3 there are shown components of another embodiment of the invention. The illustration in FIG. 3 is limited substantially to those parts which differ from the corresponding parts of the embodiment shown in FIGS. 1 and 2. There is thus shown in FIG. 3 a vessel 4 consisting of semiconductor material of the same type as that of the semiconductor discs 2 which are contained in the vessel 4. It is closed in a desired manner with a cup-like cover 18 inserted in the open end of the vessel 4 and held in position at that end by a pin 19 passing through radially extending bores provided in the cover 18 and the walls of the vessel 4 which are in registry with one another. The pin 19 also extends through a transverse bore formed through the beefed-up or enlarged end 20 of a rod 21 extending into the cup-shaped cover 18. The upper end of the rod 21 has another enlarged portion 22 also provided with a transverse bore therethrough. A pin 15 extends through the bore in the enlarged portion 22 and is suitably supported on the ends thereof in a groved formed in a flange 17 located at the upper end of the tube 9. The cover 18, the pin 19 and the rod 21 consist of the same material as that of the vessel 4. In the embodiment of FIG. 3, the vessel 4 is not heated with a resistance furance but rather by means of an induction heating coil 23 energized with high frequency alternating current which surrounds the chamber 6 at the level of the vessel 4. Since it is possible to inductively heat highly pure silicon only with great difficulty at room temperature, the vessel 4 which consists completely of highly pure silicon, must be preheated, for example by means of suitable radiation. The silicon vessel 4 can also be heated purely by induction if it is surrounded with a conductive layer such as graphite, for example. It is also possible to render at least a portion of the silicon vessel electrically conductive at room temperature by introducing impurities therein. Such a construction of the silicon vessel is automatically produced during its use because, after the termination of a diffusion operation, not only the semiconductor discs but also the inner surface of the vessel 4 and the cover 5 are coated with the doped conductive layer.

When employing inductive heating, care must be taken that the temperature of the silicon vessel be observed and recorded by suitable temperature supervision and inspection. In this case, the temperature is measured advantageously with a non-illustrated pyrometer. When employing a pyrometer, however, the vacuum chamber must be transparent. Virtually the only material suitable therefor is quartz. The use of quartz in this case is permissible, however, because the quartz chamber can be cooled for example by means of an air current.

In FIG. 4 there is shown another embodiment of the vessel shown in FIGS. 1 and 3 wherein the cover 5' of the vessel 4' is of an inverted cup shape and is stuck onto the open end of the vessel 4' whereby an adequate closure thereof is achieved.

For more limited demands as to the degree of purity of the semiconductor discs, it is sufficient under certain conditions to make the vessel 4' of a less pure material such as a graphite, for example, and to coat the inner walls thereof the layer 40 of highly pure semiconductor material.

It has also been found as a further advantage of my invention that, with the diffusion vessel shown for example in the figures, a specific penetration depth of the foregin substance or impurity into the semiconductor material is achieved in a considerably shorter period than when using a quartz ampule. For example, when indiffusing vaporous aluminum into a silicon member within a quartz ampule at a diffusion temperature of 1250° C. for a diffusion period of thirty hours, a penetration depth of about 80$\mu$ is obtained, whereas when the indiffusion process is carried out in a silicon vessel under the same conditons, a penetration dept of about 150$\mu$ is achieved. This is explainable by the fact that in quartz ampules, an oxide layer is always formed on the silicon member during the diffusion process. The aluminum, however, has a limited solubility or diffusibility in the oxide which is less than in the silicon. This limited diffusbility determines the concentration of the aluminum in the marginal portions of the silicon located beneath the oxide layer. Consequently, a maximum marginal or border concentration of about $4 \cdot 10^{16}$ atoms of aluminum per cm.$^3$ is obtained in quartz ampules. On the other hand, no oxide layer is formed on the silicon members in the silicon vessel. Consequently, a marginal concentration of about $10^{20}$ atoms of aluminum per cm.$^3$ is achieved when carrying out the diffusion process in a silicon vessel. Since silicon has a greater thermal stability than quartz, by using a silicon vessel, the diffusion temperature can moreover be increased above 1250° C. to just below the melting point of silicon, for example to about 1350° C., and the length of the period for carrying out the diffusion operation can thereby be further reduced.

I claim:

1. In apparatus for indiffusing impurities in semiconductor wafers for electronic components by heating the same in a neutral atmosphere, a vessel formed at least at the inner surface thereof with a continuous layer consisting of semiconductor material of the same type as that of the semiconductor wafers, said vessel being a hollow cylindrical member open only at one end thereof and disposed in upright position, said vessel having an axial length greater than the inner diameter thereof so as to accommodate therein a stack of semiconductor wafers and a source of impurities superimposed thereon, means for covering said open end of said vessel so as to completely close said vessel, said covering means being formed at least at the inner surface thereof with a layer of the same material as that of said layer of said vessel, said vessel being disposed in a closed chamber means having walls formed of material selected from the group consisting of quartz and aluminum oxide, and spaced on all sides from said walls, and including means for suspending said vessel in said chamber, said suspending means comprising a rod mounted in said chamber and consisting of the same type of semiconductor material as that of said wafers.

2. Apparatus according to claim 1, wherein said chamber is a vacuum chamber and is connnected to a high vacuum pump.

3. Apparatus according to claim 1, wherein said vessel is formed with an outer layer of conductive material, and including an electric heating coil adjacent said vessel for inductively heating the same.

4. Apparatus according to claim 3, wherein said outer layer consists of graphite.

References Cited

UNITED STATES PATENTS

| | | | |
|---|---|---|---|
| 263,830 | 9/1882 | Weston | 118—49 X |
| 3,001,892 | 9/1961 | Koller | 118—49 X |
| 3,140,965 | 7/1964 | Reuschel | 148—175 |
| 3,211,128 | 10/1965 | Potter et al. | 118—49.1 |
| 3,226,254 | 12/1965 | Reuschel | 118—49.5 X |
| 1,584,728 | 5/1926 | Case | 118—49 X |
| 2,686,212 | 8/1954 | Horn et al. | 219—10.49 X |
| 2,851,342 | 9/1958 | Bradshaw et al. | |
| 3,036,888 | 5/1962 | Lowe. | |
| 3,213,826 | 10/1965 | Lins et al. | 118—49.1 |
| 3,227,431 | 1/1966 | Steeves | 118—48 X |
| 3,243,174 | 3/1966 | Sweet. | |
| 3,244,141 | 5/1966 | Weech et al. | 118—48 |
| 3,293,074 | 12/1966 | Nickl | 118—49.5 X |

OTHER REFERENCES

Chamberlin et al.: Diffusion Using a Ternary Alloy Source," I.B.M. Technical Disclosure Bulletin, vol. 6, No. 1, June 1963, p. 114.

MORRIS KAPLAN, Primary Examiner